(12) United States Patent
Lee

(10) Patent No.: US 8,154,010 B2
(45) Date of Patent: Apr. 10, 2012

(54) MEMORY DEVICE AND METHOD OF FABRICATING THE SAME

(75) Inventor: Seung-Hyun Lee, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 188 days.

(21) Appl. No.: 12/318,502

(22) Filed: Dec. 30, 2008

(65) Prior Publication Data

US 2010/0065817 A1 Mar. 18, 2010

(30) Foreign Application Priority Data

Sep. 12, 2008 (KR) .................. 10-2008-0090384

(51) Int. Cl.
*H01L 29/12* (2006.01)
*H01L 21/20* (2006.01)
(52) U.S. Cl. ............... 257/14; 257/E21.4; 257/E29.07; 257/E21.09; 438/478; 977/762; 977/742
(58) Field of Classification Search .............. 257/14, 257/E29.07, E21.09; 438/142, 478; 977/742, 977/762; 365/151
See application file for complete search history.

(56) References Cited

U.S. PATENT DOCUMENTS

| | | | | |
|---|---|---|---|---|
| 2005/0224790 | A1* | 10/2005 | Jin et al. | 257/43 |
| 2008/0239790 | A1* | 10/2008 | Herner et al. | 365/151 |
| 2008/0299710 | A1* | 12/2008 | Tombler et al. | 438/142 |

FOREIGN PATENT DOCUMENTS

| | | |
|---|---|---|
| JP | 2002-346996 | 12/2002 |
| KR | 1020040056441 | 7/2004 |
| KR | 1020040107700 | 12/2004 |
| KR | 1020060024197 | 3/2006 |

OTHER PUBLICATIONS

Korean Notice of Allowance for application No. 10-2008-0090384, citing the above references.
"Carbon Nanotube-Based Nonvolatile Random Access Memory for Molecular Computing"; Thomas Rueckes, et al., Science 289, pp. 94-97, Jul. 7, 2000.

* cited by examiner

*Primary Examiner* — Davienne Monbleau
*Assistant Examiner* — Whitney T Moore
(74) *Attorney, Agent, or Firm* — Lowe Hauptman Ham & Berner, LLP

(57) ABSTRACT

A memory device includes a first electrode, a second electrode spaced apart from the first electrode and a nanotube or nanowire network disposed between the first electrode and the second electrode, having a stacked structure of a P-type network and an N-type network, and having a diode characteristic. Since the nanotube or nanowire network has the stacked structure of the P-type network and the N-type network, and has the diode characteristic, it is possible to enhance a degree of integration of the memory device and simplify the fabrication processes without separately requiring a selection device.

13 Claims, 5 Drawing Sheets

OFF

ON

MEMORY DEVICE AND METHOD OF FABRICATING THE SAME

CROSS-REFERENCE TO RELATED APPLICATIONS

The present application claims priority of Korean patent application number 10-2008-0090384, filed on Sep. 12, 2008, which is incorporated herein by reference in its entirety.

BACKGROUND

One or more embodiments relate to memory device technology and fabrication technology thereof, and more particularly, to a memory device employing a nanotube or nanowire network as a storage component, and a method of fabricating the memory device.

In memory devices used in electronic instruments, some factors to consider are the costs of production, nonvolatility, high-density, low power consumption, etc. Dynamic random access memory (DRAM) devices are commonly used memory devices in electronic instruments and can achieve high speeds and a high degree of integration. However, these devices require periodic refreshing due to their volatile characteristic and thus, they consume large amounts of power. On the other hand, flash memory devices have the advantage of a nonvolatile characteristic, yielding low production costs and low power consumption. Conversely, operating speed is low and information can only be stored for limited amounts of time. Therefore, research for developing a memory device having the advantages of both, the DRAM device and the flash memory device is currently in progress.

Recently, various researches for the development of a memory device using nano technology have been achieved. Specifically, a memory device, which switches between an on state and an off state according to a junction state of nanotubes or nanowires arranged in directions intersecting each other, is disclosed in an article entitled "Carbon Nanotube-Based Nonvolatile Random Access Memory for Molecular Computing", released in Vol. 289 of Science Magazine, 2000. In particular, a pair of single-walled carbon nanotubes (SWNTs) arranged in the directions intersecting each other has different junction states, i.e., a separated state (refer to FIG. 1A) or a connected state (refer to FIG. 1B), according to bias coupled thereto. If the pair of nanotubes is separated from each other, current flowing through the pair of nanotubes becomes relatively small and thus the pair of nanotubes has the off state. On the other hand, if the pair of nanotubes is connected to each other, current flowing through the pair of nanotubes becomes relatively great and thus the pair of nanotubes has the on state. As described above, it is possible to fabricate the memory device by using the junction state formed by the pair of nanotubes. Thus, one junction formed by the pair of nanotubes constructs one memory cell. Since the on/off state is maintained although the bias supplied from the external is interrupted, a nonvolatile memory device may be fabricated using such a characteristic. However, mass production of these devices is difficult to achieve due to the problems associated with individual nanotubes or nanowires.

Presently, there is an approach to insert a 3-dimensional network structure, formed by a random arrangement of nanotube or nanowire junction pairs, between an upper electrode and a lower electrode and to construct a memory cell using the network structure as the storage component.

FIGS. 2A and 2B illustrate views of a memory device employing a conventional carbon nanotube network. FIG. 2A describes a storage component of a memory cell. FIG. 2B shows a cell array constructed in a matrix structure, wherein the cell array includes a unit memory cell having the storage component described in FIG. 2A.

Referring to FIG. 2A, the storage component includes a lower electrode 21, an upper electrode 23, and a carbon nanotube network 22 disposed between the lower electrode 21 and the upper electrode 23. Herein, the carbon nanotube network 22 has a pattern with a specific shape.

The carbon nanotube network 22 is constructed with a number of carbon nanotubes arranged in random directions and thus a plurality of junctions is formed among the carbon nanotubes. The plurality of junctions included in the carbon nanotube network 22 is separated or in contact with each other according to bias coupled between the lower electrode 21 and the upper electrode 23. Therefore, the carbon nanotube network 22 shows a bi-stable on/off state as a whole.

FIG. 2B displays a carbon nanotube network arranged in a matrix of a unit memory cells "A", each unit memory cell having the CNT of the storage component illustrated in FIG. 2A.

A selection device such as the transistor T is positively necessary in order to gain access to a certain memory cess. Therefore, in addition to one carbon nanotube network, CNT, each unit memory cell A includes one transistor T. This is because the carbon nanotube network storage component alone does not have a selection function.

As describe above, since the unit memory cell requires a selection device such as a transistor and a storage component such as a carbon nanotube network, the area occupied by the selection device will deteriorate the degree of integration of the memory device. Furthermore, since a first process of forming the transistor and a second process of forming a contact to achieve the junction with the transistor are required, the fabrication process of the memory device becomes complicated.

SUMMARY

One or more embodiments are directed to a memory device employing a nanotube or nanowire network capable of improving its degree of integration and simplifying a manufacturing process by forming the nanotube or nanowire network to have a pn-junction structure of an N-type network and a P-type network so that the nanotube or nanowire network itself has a diode characteristic without requiring a separate selection device, and a method of fabricating the memory device.

One or more embodiments are directed to a memory device including: a first electrode; a second electrode spaced apart from the first electrode; and a nanotube or nanowire network disposed between the first electrode and the second electrode, having a pn-junction structure of a P-type network and an N-type network, and having a diode characteristic.

One or more embodiments are directed to a method of fabricating a memory device, the method including: forming a first electrode over a substrate; forming a nanotube or nanowire network having a pn-junction structure of a P-type network and an N-type network over the first electrode; and forming a second electrode over the nanotube or nanowire network.

One or more embodiments are directed to a memory device having a crossbar structure, the memory device including: a plurality of first electrodes arranged in parallel and extending in a first direction; a plurality of second electrodes arranged in parallel, spaced apart from the first electrodes and extending in a second direction intersecting the first direction; and a first nanotube or nanowire network disposed at each intersection of the first electrodes and the second electrodes, including a pn-junction structure of a P-type network and an N-type network, and having a diode characteristic.

One or more embodiments are directed to a method of fabricating a memory device having a crossbar structure, the method including: forming a first conductive layer and a nanotube or nanowire network layer over a substrate, wherein the nanotube or nanowire network layer includes a pn-junction structure of a P-type network layer and an N-type network layer; patterning the first conducive layer and the nanotube or nanowire network layer, thereby forming a plurality of first electrodes arranged in parallel and extending in a first direction; forming a second conductive layer over a resultant structure; and patterning the second conductive layer and the nanotube or nanowire network layer, thereby forming a plurality of second electrodes arranged in parallel and extending in a second direction intersecting the first direction.

DESCRIPTION OF EMBODIMENTS

Figure 1A:
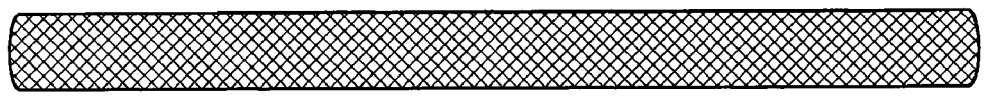
FIGS. 1A and 1B illustrate views of a memory device employing a pair of conventional carbon nanotubes.
Figure 1A:
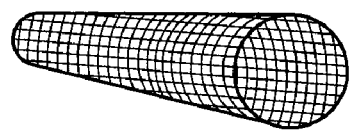
Figure 1B:
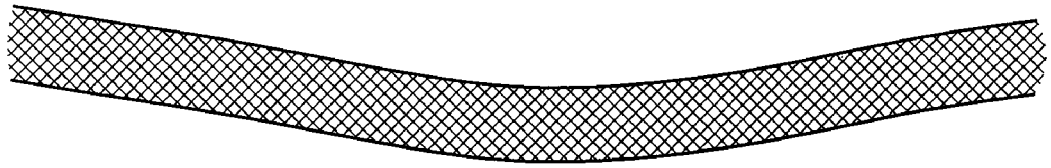
Figure 1B:
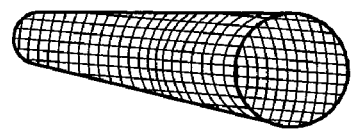
Figure 2A:
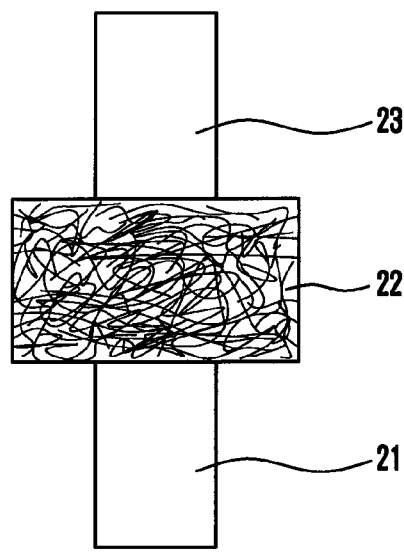
FIGS. 2A and 2B illustrate views of a memory device employing a conventional carbon nanotube network.
Figure 2B:
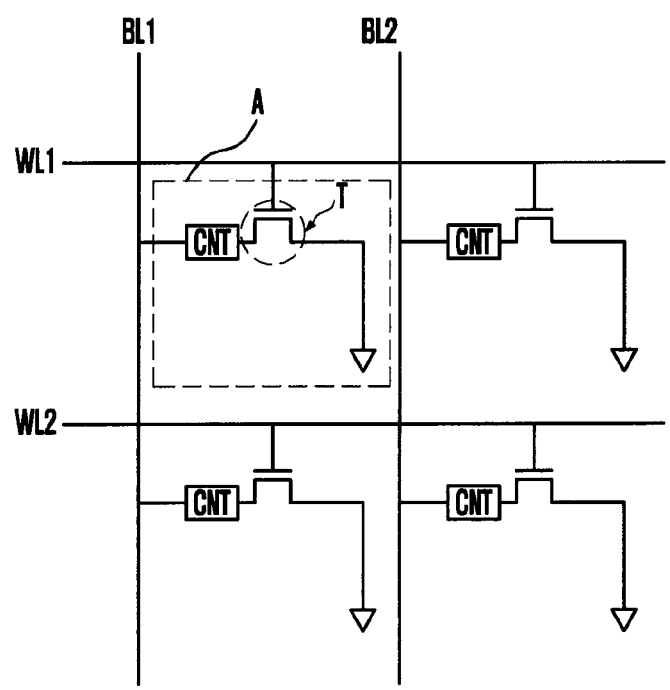

Other objects and advantages of the present invention can be understood by the following description, and become apparent with reference to the embodiments. In the figures, the dimensions of layers and regions are exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates may also be present.

Figure 3A:
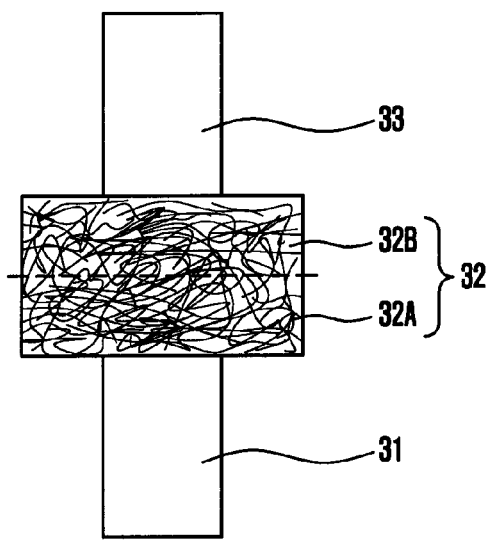
FIGS. 3A and 3B illustrate views of a memory device employing a carbon nanotube network of one embodiment.
Figure 3B:
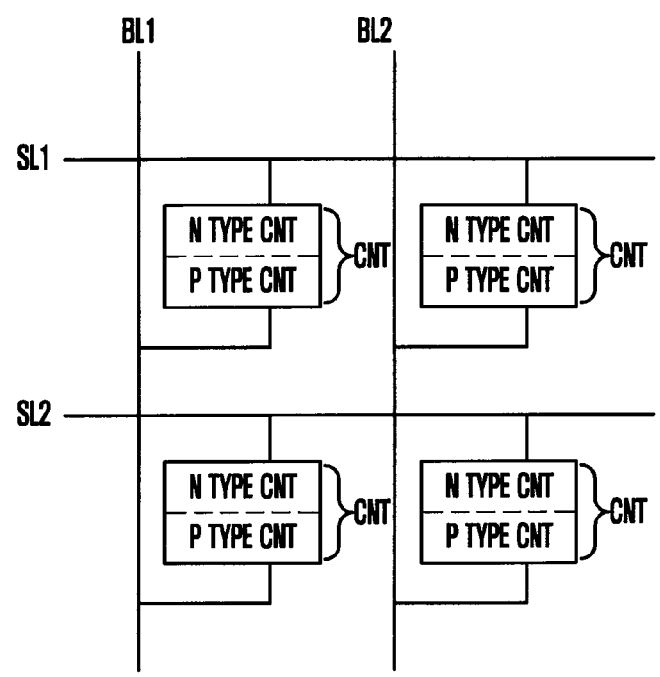

FIGS. 3A and 3B illustrate views of a memory device employing a carbon nanotube network of one embodiment. FIG. 3A describes a single storage component. FIG. 3B shows a matrix of cell arrays, wherein each cell array includes a unit memory cell having the carbon nanotube network storage component described in FIG. 3A. The structure of a memory device employing the carbon nanotube network will now be described.

Referring to FIG. 3A, the storage component includes a lower electrode 31, an upper electrode 33, and a carbon nanotube network 32 disposed between the lower electrode 31 and the upper electrode 33, wherein the carbon nanotube network 32 has a pattern with a specific shape. The carbon nanotube network 32 has a pn-junction structure where a P-type network 32A and an N-type network 32B are stacked. This embodiment describes that the P-type network 32A is disposed under the N-type network 32B. However, their stack order is not limited to the above embodiment. That is, the P-type network 32A may be disposed on the N-type network 32B.

The carbon nanotube network 32 having the pn-junction structure is a storage component having bi-stable on/off states controlled by the bias coupled between the lower electrode 31 and the upper electrode 33. Furthermore, the carbon nanotube network 32 does not require a selection device separately since it has properties of the pn-junction structure. That is, it is possible to construct a unit memory cell with only the carbon nanotube network 32.

As illustrated in FIG. 3B, a matrix of unit memory cells, each including one carbon nanotube network CNT constructs a cell array. In such a cell array, it is possible to gain access to a certain desired memory cell by selecting any one of the associated column lines, e.g., bit lines BL1 and BL2, connected to a P-type network of the carbon nanotube network CNT and any one of the associated row lines, e.g., source lines SL1 and SL2, connected to an N-type network of the carbon nanotube network CNT. According to the bias coupled between a selected column line and a selected row line, a junction state within the carbon nanotube network CNT is arranged, so that the carbon nanotube network CNT shows an on state then the current flow through the carbon nanotube network CNT is too large or an off state when the current flow through the carbon nanotube network CNT is too small.

Hereinafter, a method of fabricating the memory device will be described. Referring to FIG. 3A, the lower electrode 31 is formed on a substrate. Then, a P-type carbon nanotube network layer is formed on the lower electrode 31. The P-type carbon nanotube network layer is formed by first growing undoped carbon nanotubes, then doping them with P-type impurities. Alternatively, the carbon nanotubes can be grown pre-doped. It should be noted that other methods exist for forming the CNT network layer.

An N-type carbon nanotube network layer is formed on the P-type carbon nanotube network layer, which is formed in the same manner. Subsequently, the N-type carbon nanotube network layer and the P-type carbon nanotube network layer are patterned to thereby form the carbon nanotube network 32 having the pn-junction structure where the P-type network 32A and the N-type network 32B are stacked. The upper electrode 33 is then formed on the carbon nanotube network 32.

Connecting a junction of the transistor with the lower electrode does not require a transistor forming process or a contact forming process to connect a junction of a transistor with the lower electrode 31; thus, the embodiment has an advantage of simplifying processes.

Meanwhile, since, in the memory device illustrated in FIGS. 3A and 3B, the unit memory cell is constructed with only one carbon nanotube network without a selection device and the carbon nanotube network itself has a diode characteristic, it is possible to implement a crossbar memory device. The crossbar memory device includes a plurality of parallel lower electrodes extending in a first direction and a plurality of parallel upper electrodes extending in a second direction, the second direction intersecting the first direction, and one storage component disposed at each intersection of the lower electrodes and the upper electrodes. This configuration constructs a unit memory cell, making it possible to substantially increase a degree of integration of the memory device.

Figure 4:
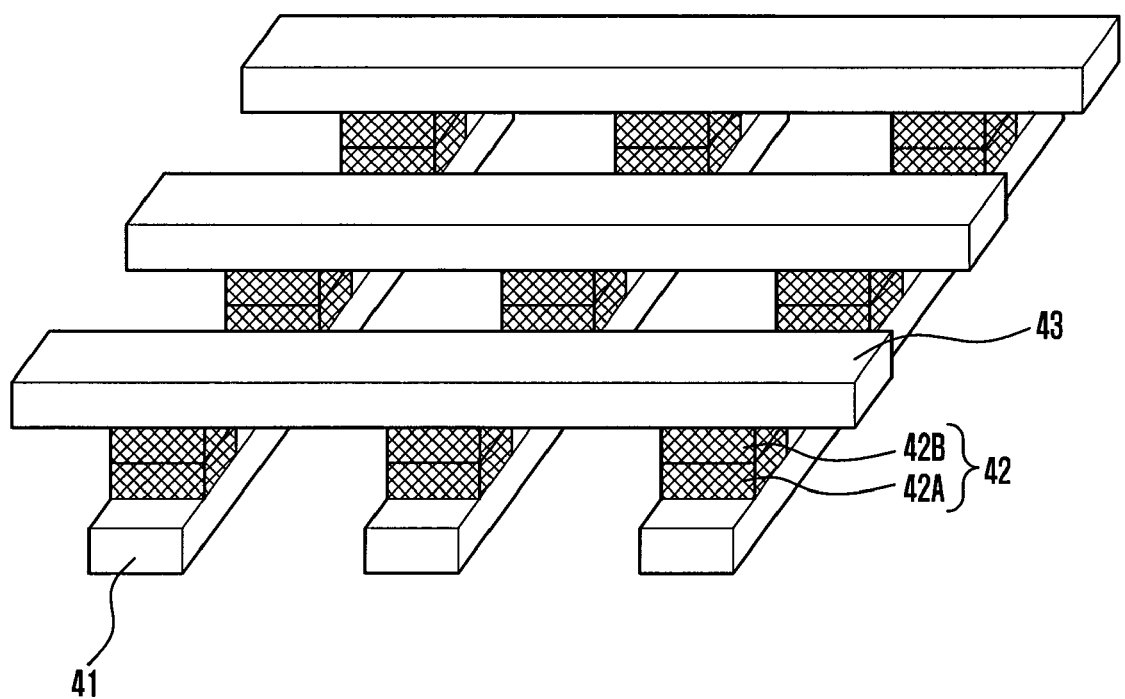
FIGS. 4 and 5 illustrate perspective views of crossbar memory devices of some embodiments, respectively.

FIG. 4 illustrates a perspective view of a crossbar memory device, which will, hereinafter, be described. Referring to FIG. 4, a carbon nanotube network 42 is deposited at an intersection of a lower electrode 41 extending in a first direction and an upper electrode 43 extending in a second direction, the second direction intersecting the first direction, serves as the storage component. As described above, the carbon nanotube network 42 has a stack structure of a P-type network 42A and an N-type network 42B. Herein, the lower electrode 41 may correspond to the bit line BL illustrated in FIG. 3B and the upper electrode 43 may correspond to the source line SL illustrated in FIG. 3B, but they are not limited thereto.

When the carbon nanotube network does not show a diode characteristic, it is difficult to realize the cross bar memory device because parasitic current flows from the crossbar memory device. However, when the carbon nanotube network itself has the diode characteristic, the current only flows in one direction; thus, the parasitic current does not flow.

Figure 5:
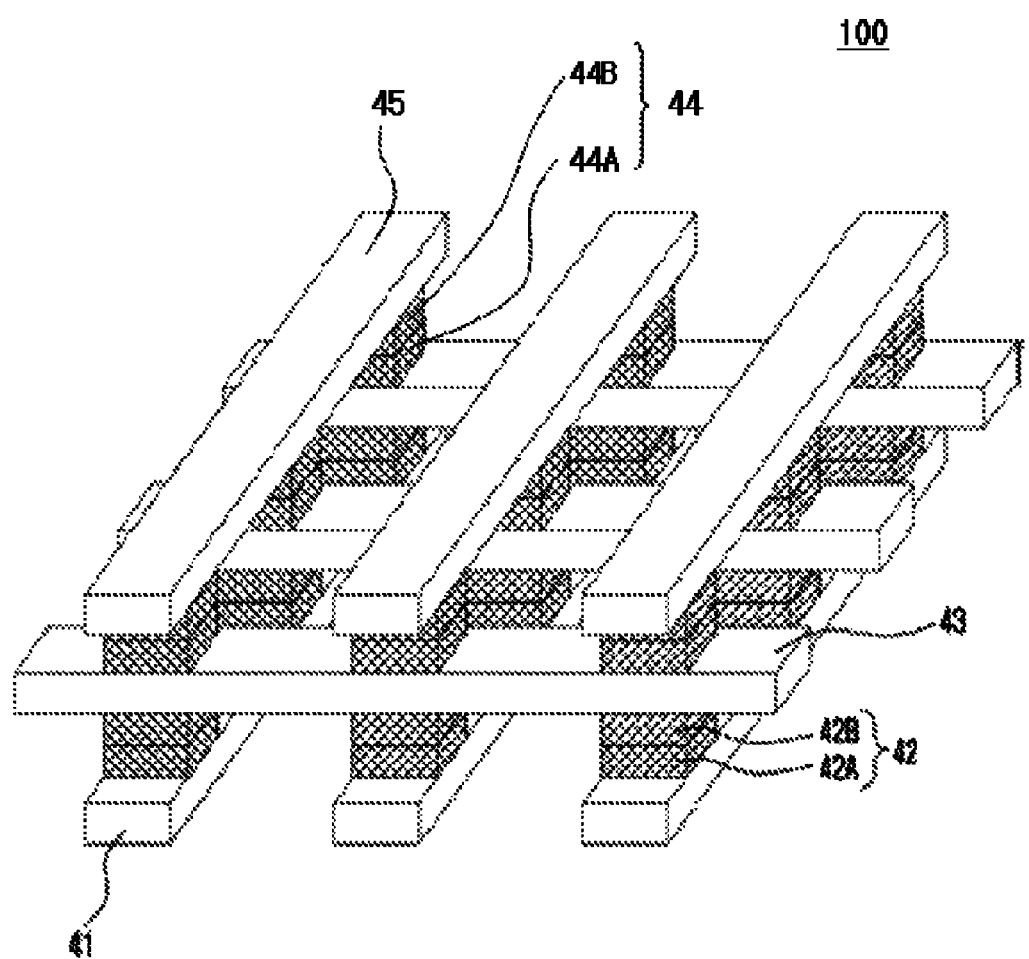

When using the crossbar memory device, the memory device can be much more highly integrated by implement a multi-layered stack structure 100 as shown in FIG. 5. The multi-layered stack structure 100 may be constructed by stacking a second carbon nanotube network 44 on the upper electrode 43 and disposing a third electrode 45 on the second carbon nanotube network 44. Referring to FIG. 5, a plurality of third electrodes 45 is arranged in parallel, spaced apart from the second electrodes 43 and is extended in a third direction intersecting the second direction. The second carbon nanotube network 44 is disposed at each intersection of the second electrodes 43 and the third electrodes 45. The second carbon nanotube network 44 includes a stack structure of a P-type network 44A and an N-type network 44B, and has a diode characteristic. According to the embodiment of the present invention, the third direction is identical to the first direction. In this manner, the lower electrode 41, the carbon nanotube network 42 and the upper electrode 43 construct a lower stack and the upper electrode 43, the second carbon nanotube network 44 and the third electrode 45 construct an upper stack. Herein, the upper electrode 43 is used as a common electrode for the upper and the lower stacks. The stack structure can be repeated as desired.

Hereinafter, a method of fabricating the crossbar memory device will be described. The lower electrode 41 is formed by depositing a conductive layer on a substrate. A P-type carbon nanotube network layer and an N-type carbon nanotube network layer are stacked, forming the carbon nanotube network 42 thereon. Then the N-type carbon nanotube network layer, the P-type carbon nanotube network layer and the conductive layer are patterned using a mask pattern (not shown) thereby forming the lower electrode 41. As a result, the lower electrode 41 is formed and a first patterned P-type carbon nanotube network layer and a first patterned N-type carbon nanotube network layer, both having the same shape as the lower electrode 41, are formed thereon.

After forming an insulation layer (not shown) over the exterior surface of the resultant structure, the first patterned N-type carbon nanotube network layer is exposed by planarization of the insulation layer. Subsequently, the upper electrode 43 is formed on a resultant structure by deposition of a conductive layer thereon. The conductive layer, the first patterned N-type carbon nanotube network layer and the first patterned P-type carbon nanotube network layer are then patterned a second time, forming the upper electrode and the carbon nanotube network 42, in an island shape under the upper electrode 43.

The inventive memory device can have an improved degree of integration and a simplified manufacturing process by forming the nanotube or nanowire network to have the pn-junction structure of the N-type network and the P-type network. The pn-junction structure provides the nanotube or nanowire network with a diode characteristic without requiring a separate selection device.

While the embodiments have been described, it will be apparent to those skilled in the art that various changes and modifications may be made. In addition to the embodiments describing the memory device employing the carbon nanotube network as the storage component, they can also be applied to any other memory device using the nanotube or nanowire network capable of constructing different junction states according to voltages applied thereto.

What is claimed is:

1. A memory device having a crossbar structure, the memory device comprising:
 a plurality of first electrodes arranged in parallel and extending in a first direction;
 a plurality of second electrodes arranged in parallel, spaced apart from the first electrodes, and extending in a second direction intersecting the first direction; and
 a first nanotube or nanowire network disposed at each intersection of the first electrodes and the second electrodes, including a stacked structure of a P-type network and an N-type network, and having a diode characteristic, the stacked structure comprising an upper portion, a lower portion, and a heterojunction defined between the upper portion and the lower portion, one of the upper or lower portions being the P-type network, and the other one of the upper or the lower portions being the N-type network,
 wherein each of the first electrodes is connected to one of the P-type network and the N-type network and each of the second electrodes is connected to the other of the P-type network and the N-type network.

2. The memory device of claim 1, wherein a junction state between nanotubes or a junction state between nanowires in the first nanotube or nanowire network is changed according to bias coupled to the first and the second electrodes, thereby showing an on state or an off state.

3. The memory device of claim 1, wherein the first nanotube or nanowire network is a carbon nanotube network.

4. The memory device of claim 1, further comprising:
 a plurality of third electrodes arranged in parallel, spaced apart from the second electrodes, and extending in a third direction intersecting the second direction; and
 a second nanotube or nanowire network disposed at each intersection of the second electrodes and the third electrodes, including a stacked structure of a P-type network and an N-type network, and having a diode characteristic.

5. The memory device of claim 4, wherein the third direction is identical to the first direction.

6. The memory device of claim 1, wherein the first nanotube or nanowire network includes a pn-junction structure formed at the heterojunction between the P-type network and the N-type network.

7. A method of fabricating a memory device having a crossbar structure, the method comprising:
 forming a first conductive layer and a nanotube or nanowire network layer over the first conductive layer, wherein the nanotube or nanowire network layer includes a stacked structure of a P-type network layer and an N-type network layer the stacked structure comprising an upper portion, a lower portion, and a heterojunction defined between the upper portion and the lower portion, one of the upper or lower portions being the P-type network layer, and the other one of the upper or the lower portions being the N-type network layer;
 patterning the nanotube or nanowire network layer and the first conducive layer, thereby forming a plurality of first electrodes arranged in parallel and extending in a first direction, a P-type network, and an N-type network;
 forming a second conductive layer over a resultant structure; and
 patterning the second conductive layer and the nanotube or nanowire network layer, thereby forming a plurality of second electrodes arranged in parallel and extending in a second direction intersecting the first direction;

wherein the first conductive layer is connected to one of the P-type network and the N-type network and the second conductive layer is connected to the other of the P-type network and the N-type network.

8. The method of claim 7, wherein forming of the nanotube or nanowire network layer comprises:

forming a first network layer by growing a nanotube or nanowire that is not doped with impurities and doping the first network layer with P-type impurities, thereby forming the P-type network layer; and forming a second network layer by growing a nanotube or nanowire that is not doped with impurities and doping the second network layer with N-type impurities, thereby forming the N-type network layer.

9. The method of claim 7, wherein forming of the nanotube or nanowire network layer comprises:

growing a nanotube or nanowire doped with P-type impurities, thereby forming the P-type network layer; and growing a nanotube or nanowire doped with N-type impurities, thereby forming the N-type network layer.

10. The method of claim 7, wherein the nanotube or nanowire network layer is a carbon nanotube network layer.

11. The method of claim of claim 7, wherein the nanotube or nanowire network includes a pn-junction structure formed at the heterojunction between the P-type network and the N-type network.

12. A memory device having a crossbar structure, the memory device comprising:

a plurality of first electrodes arranged in parallel and extending in a first direction;

a plurality of second electrodes arranged in parallel, spaced apart from the first electrodes, and extending in a second direction intersecting the first direction;

a first nanotube or nanowire network disposed at each intersection of the first electrodes and the second electrodes, including a stacked structure of a P-type network and an N-type network, and having a diode characteristic;

a plurality of third electrodes arranged in parallel, spaced apart from the second electrodes, and extending in a third direction intersecting the second direction; and a second nanotube or nanowire network disposed at each intersection of the second electrodes and the third electrodes, including a stacked structure of a P-type network and an N-type network, and having a diode characteristic;

wherein each of the first electrodes is connected to one of the P-type network and the N-type network and each of the second electrodes is connected to the other of the P-type network and the N-type network.

13. The memory device of claim 12, wherein the third direction is identical to the first direction.

* * * * *